United States Patent [19]

Wilcox

[11] 4,110,697
[45] Aug. 29, 1978

[54] DIGITAL BYPASSABLE REGISTER INTERFACE

[75] Inventor: Dwight R. Wilcox, San Deigo, Calif.

[73] Assignee: The United States of America as represented by the Secretary of the Navy, Washington, D.C.

[21] Appl. No.: 770,333

[22] Filed: Feb. 22, 1977

[51] Int. Cl.² .......................................... H03K 17/02
[52] U.S. Cl. ..................................... 328/154; 328/71; 328/72; 307/DIG. 1
[58] Field of Search ........... 307/241, 242, 243, 247 R, 307/DIG. 1; 328/152, 153, 154, 72, 71

[56] References Cited

U.S. PATENT DOCUMENTS

| | | | |
|---|---|---|---|
| 2,866,092 | 12/1958 | Raysnford | 328/152 X |
| 3,461,313 | 8/1969 | Hansen | 328/153 X |
| 3,693,028 | 9/1972 | Fussell | 307/247 R |
| 3,742,466 | 6/1973 | Hamm et al. | 307/241 X |
| 3,829,786 | 8/1974 | Hoffman et al. | 328/154 X |

Primary Examiner—John S. Heyman
Attorney, Agent, or Firm—R. S. Sciascia; G. J. Rubens; H. Fendelman

[57] ABSTRACT

An interface for transmitting data in either a clock edge triggered synchronous transmission mode or an asynchronous transmission mode. An edge triggered register has its input connected to a source of digital data and its output connected to a two-to-one muliplexer. A bypass path connected between the digital data source and the multiplexer is provided around the edge triggered register. The two-to-one multiplexer is selectively actuable to provide either asynchronous transmission by connecting the bypass path to an output means or to provide synchronous transmission by connecting the output of the edge triggered register to the output means.

9 Claims, 2 Drawing Figures

DIGITAL BYPASSABLE REGISTER INTERFACE

BACKGROUND OF THE INVENTION

The present invention relates to the field of interface devices used for transmitting data between functionally partitioned electronic devices or modules and more specifically to interfaces that have the flexibility for both asynchronous and clock edge triggered synchronous transmission of data.

Presently, the latch circuit is used to implement the interface when both the asynchronous and the synchronous transmission of data is devised. The latch has a control line which has two states. In one state the latch passes data. The latch output asynchronously follows the input data. This condition continues until the latch is placed in the second control state. Then whatever output was present just prior to the control line transition is held on the latch output regardless of fluctuations on the input later in time. The output again follows the input upon transition back to the first control state.

Difficulties with the latch circuit arise when an attempt is made to connect the output of asynchronous functional circuitry to an input of the same circuitry through a latch interface. When the inputs to the asynchronous functional circuitry are altered, the outputs, after some time $T_1$, go into a transient state until time $T_2$. When the output feeds into an input, the latch must pass the output data into itself and transfer to the hold state within the time $T_1$. If this time restriction is not met, a "race" condition will occur causing the circuitry to go unstable. In general, $T_1$ will be varied over a wide range of values depending upon the complexity of the functional circuitry. It is even possible that $T_1$ may be shorter than the response of the latch control line for some implementations making utilization totally impossible.

Another known interface device is the edge triggered register. On the directed transition of a clock signal, the input of the edge triggered register is transferred to the output. The register does not have the race danger experienced with the latch circuit, but is unsuitable for many applications due to the fact that it is incapable of asynchronous transmission of data.

SUMMARY OF THE INVENTION

In accordance with the present invention, a bypassable register circuit is disclosed which provides an electronic digital interface for functionally partitioned digital networks which has the flexibility for both asynchronous and clock edge triggered synchronous transmission of data without the danger of a "race" condition and without the critical timing restrictions that are imposed on the commercially available latch in order to prevent the "race" condition. The bypassable register of the present invention also provides input and output buffering. The high impedance input buffer allows the interface to share current drive with the input of other circuits with minimum loading. The three-state output buffer of the present invention provides a third high impedance state to enable the interface to be bussed with three-state outputs from other circuits.

The bypassable register of the present invention is simple to manufacture and can easily be incorporated in a single TTL package. While supporting both asynchronous and synchronous connections, the device of the present invention optimizes speed and achieves simplicity of control not previously available with the prior art latch network.

OBJECTS OF THE INVENTION

Accordingly, it is the primary object of the present invention to disclose an interface device that has the flexibility for both asynchronous and clock edge triggered synchronous transmission of data while eliminating the critical timing restriction necessary to prevent the "race" condition inherent in the latch network.

It is another object of the present invention to disclose a means for alternatively implementing the asynchronous or synchronous data transmission functions that uses a minimum of hardware and that is suitable for modularization.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
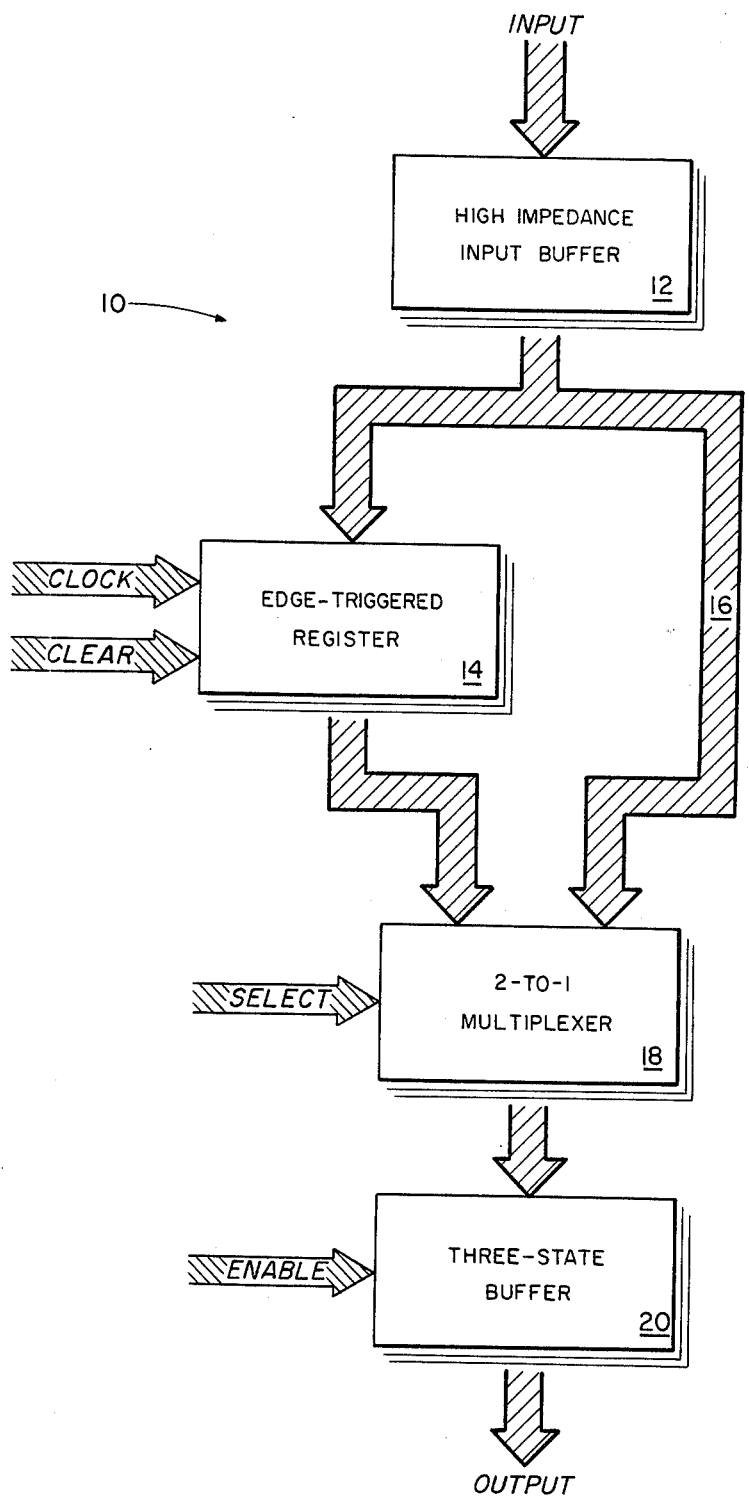
FIG. 1 is a functional block diagram of the bypassable register interface of the present invention.

A block diagram of the bypassable register interface 10 of the present invention is shown in FIG. 1. The interface input is provided with a high impedance input buffer 12 for reduced signal loading. Beyond the input buffer 12 the data signal is applied to two paths. One path goes through an edge triggered register 14 while the other path 16 goes around the register. The two paths converge at a two-to-one multiplexer 18 which selects one of the paths for output through a three-state buffer 20. The interface 10 is provided with four control signals which are as follows. The register 14 has a clock input and a clear control, the multiplexer 18 has a select control and the three-state buffer 20 has an enable control.

To implement the asynchronous data transmission function, the two-to-one multiplexer 18 inhibits the output of the edge triggered register 14 and enables conduction through the conduction path 16 to the output buffer 20. In this data transmission mode the digital data at the input to buffer 12 passes without control to the output of the buffer amplifier 20. When the synchronous data transmission mode is desired, the two-to-one multiplexer 18 inhibits the transmission of data along the conduction pass 16 and enables the output of the edge triggered register 14. In this transmission mode the appearance of a clock pulse edge at the clock control input to the edge triggered register 14 causes the register 14 to present a data signal at its output that is the data signal that was present at its input at the time the clock pulse edge occurred. It is noted that either the trailing or the leading edge of the clock pulse can be utilized. The select input to the two-to-one multiplexer 18 is used to selectively control whether the output from the edge triggered register 14 or the conduction path 16 is enabled to pass data to the output buffer 20. It is noted that either a logic "low" or logic "high" multiplexer SELECT input may be utilized to select the selection of the asynchronous path.

Figure 2:
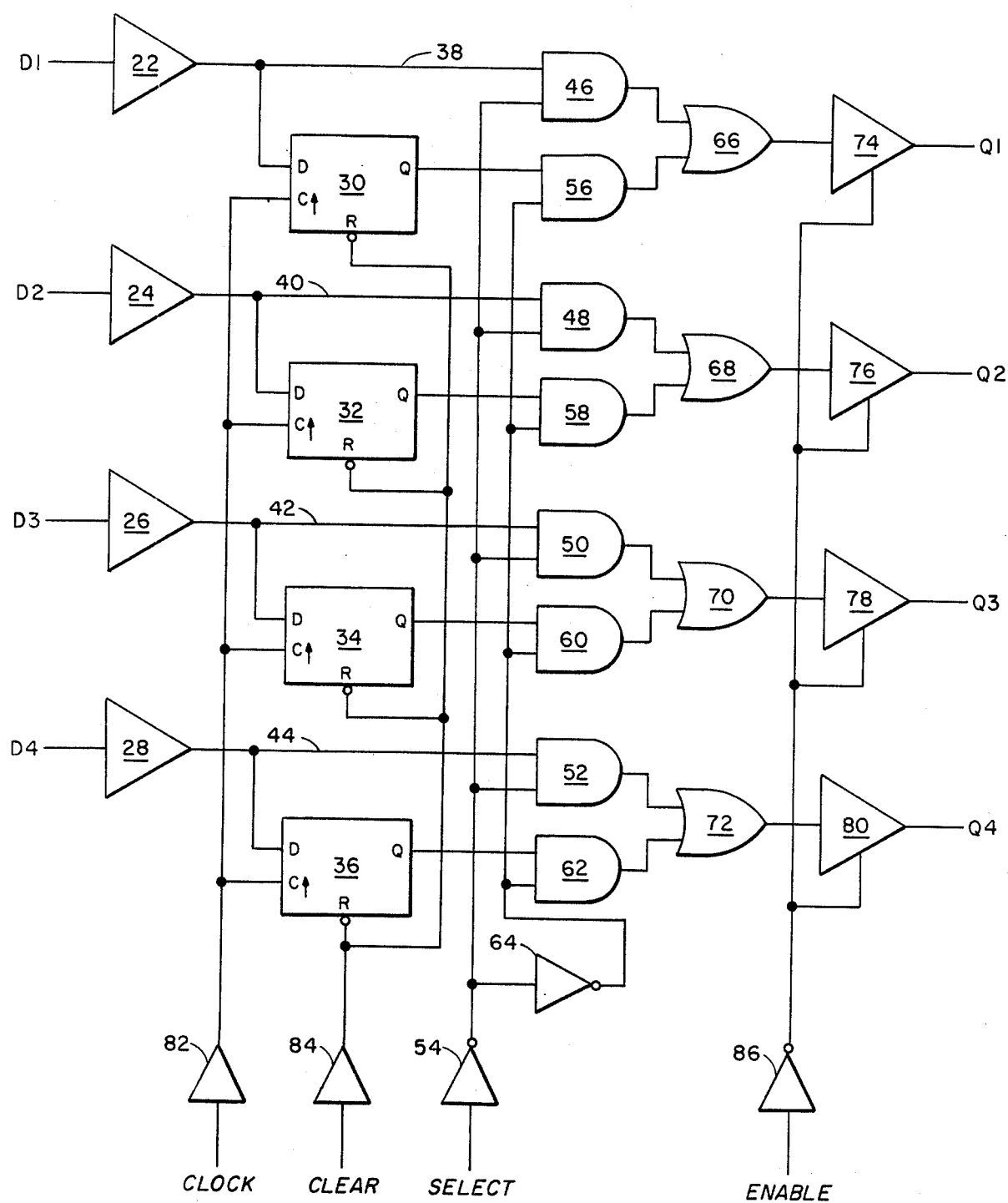
FIG. 2 is an illustration of a logic implementation of the bypassable register interface of the present invention.

Referring now to FIG. 2 a logic implementation of the interface 10 of the present invention is illustrated and will be described. The implementation of the bypassable register interface 10 illustrated in FIG. 2 has provisions for receipt of 4 parallel data channels D1, D2, D3, and D4, although it is to be understood that any number of parallel data channels could be provided for and, moreover, that a single data channel only could be provided if desired.

The high impedance input buffer 12 is comprised of buffer amplifiers 22, 24, 26, and 28. These devices act as low current line receivers such that many bypassable registers may be placed in parallel for receipt of data from the same bus without requiring the bus to have a high current driving capability.

The edge triggered register denoted as 14 in FIG. 1 is implemented in the FIG. 2 embodiment by a set of edge triggered flip-flops 30, 32, 34, and 36. Each of the flip-flops, as is conventional, has data input denoted D, a clock input denoted C, and a data output denoted Q. The rising edge, or the trailing edge if desired, of the clock input causes these flip-flops to store the input on the data lines.

Bypass paths 38, 40, 42, and 44 are connected respectively to buffers 22, 24, 26, and 28 and the corresponding elements of the two-to-one multiplexer 18 to be described. The bypass conductors thus provided an alternate path for the data around the flip-flops comprising the edge triggered register 14.

The two-to-one multiplexer 18 is comprised of a first set of logic AND gates 46, 48, 50, and 52 which each have one of their input terminals connected to its respective data channel and the second input connected to the inverter amplifier 54 at the SELECT input to the multiplexer 18. A second set of AND logic gates 56, 58, 60, and 62 each have one of their inputs connected to the data output of the corresponding flip-flops 30, 32, 34, and 36 as illustrated. The second input to the set of AND gates 56, 58, 60, and 62 is derived from the inverter amplifier 64 which receives its input from the output of the inverter amplifier 54 as illustrated. OR gates 66, 68, 70, and 72 complete the multiplexer 18. The gates making up the two-to-one multiplexer 18 select either the output of the flip-flops of the edge triggered register 14 or the output of the low current line receivers 12 depending on the state of the SELECT input. Thus the SELECT input determines whether the flip-flops, collectively called a register, are "bypassed" or not.

The three-state buffer amplifier 20 is illustrated in the FIG. 2 embodiment as the distinct buffer amplifiers 74, 76, 78, and 80. These buffer amplifiers permit several bypassable register interfaces to have their data outputs parallel connected onto the same bus. Typically, another circuit called a decoder would select one of the several interfaces to place in the active low-impedance state to transmit data to the bus. All the other interfaces would be placed in the high-impedance state so that they would not alter the bus data.

The clock inputs to each of the flip-flops 30, 32, 34, and 36 are derived from a clock source through the buffer amplifier 82. Similarly, an input buffer 84 is connected to the reset terminal of each of the flip-flops and receives its input from a suitable source for providing a signal to force the low state into all of the flip-flops. The buffers 82 and 84 are provided to reduce the loading of the control lines. Optimally, each of their input current requirements would be the sum of the current requirements of all data inputs or less. An ENABLE input inverter and buffer amplifier 86 is also provided and is connected to each of the output buffers 74, 76, 78, and 80. Ideally, the ENABLE input should be an active "low" control since most decoders circuits have active low outputs.

The operation of the logic implementation of the digital bypassable register interface of the present invention will now by described. For simplicity the channel D1 only will be described since the other channels D2, D3, and D4 function in an identical manner. Assuming that it is desired to operate in the asynchronous mode such that the data input is connected directly to the data output Q1, a digital "low" would be input at the SELECT input through the inverter amplifier 54. The inverter amplifier 54 will convert this "low" input to a "high" at the input to the AND gate 46. Assuming further that the data input from channel D1 is also a logic "high" both of the inputs to the AND gate 46 will be "high" thereby producing an output from the gate 46 and presenting a "high" input to the OR gate 66. Logic gate 66 will then output a logic "high" which will be present at the output terminal Q1. It is thus seen that a logic "high" at the data input D1 is transmitted as a logic "high" at the data output Q1. Assuming that the data input on channel D1 is a logic "low," gate 46 will provide no output or a logic "low" output and, similarly, gate 66 will also provide a logic "low? output. It is thus seen that the logic "low" at input D1 is transmitted to the interface 10 and provides a logic "low" at the output Q1.

In the synchronous mode, the register 14 output changes state only upon the unidirectional transition of the clock input. It will be assumed for purposes of this example that the transition chosen is the leading edge of the clock pulse. To implement this function, a digital "high" input signal is provided on the SELECT input. This digital "high" will then be inverted by inverter 54 to a digital "low." This digital "low" will inhibit the operation of AND gate 46 such that the alternate bypass path 38 is inhibited. The digital "low" however is reconverted to a digital high by inverter amplifier 64 such that a digital "high" is present at the second input of the AND gate 56. Assuming that the digital data at the input terminal D of the flip-flop 30 is a logic "high" at the time that the leading edge of the clock pulse is present at the clock terminal C of the flip-flop 30, the flip-flop 30 will provide a logic "high" at its data output Q which will then become the first input to the logic gate 56. Logic gate 56 thus having two "highs" at its inputs will be activated to provide a logic "high" at its output which becomes a logic "high" input to the OR gate 66 and is finally passed through the buffer 74 as a logic "high" of the output terminal Q1. It is thus seen that if a logic "high" is present at the data input D of flip-flop 30 at the time the clock input leading edge goes high then a logic "high" will be present at the data output Q1. Similarly, if the data input at D is a logic "low" at the time the leading edge of the clock pulse is present at C, then the data output at Q1 will also be a logic "low."

It is to be noted that the logic implementation of the two-to-one multiplexer 18 depends on the technology chosen, e.g. ECL, TTL, MOS and that the present invention is not restricted to the particular logic implementation illustrated in FIG. 2. In addition to the many equivalent boolean logical forms of the circuit 10, the CLEAR, SELECT, and ENABLE lines could each be active "high" or active "low" logic and the register 14 could be either rising edge triggered or falling edge triggered.

Obviously many other modifications and variations of the present invention are possible in the light of the above teachings. It is therefore to be understood that within the scope of the appended claims the invention may be practiced otherwise than as specifically described.

What is claimed is:

1. An interface for transmitting data in either a clock edge triggered synchronous transmission mode or an asynchronous tranmission mode comprising:
    input means for receiving a series of digital data;
    an edge triggered register connected to said input means and including an input for receiving clock pulses;
    conducting means connected to said input means for providing a bypass path around said edge triggered register;
    output means for outputting digital pulses;
    a two-to-one multiplexer means having inputs connected to said edge triggered register and to said conducting means for selectively connecting the output of either said edge triggered register or said conducting means to said output means.

2. The interface of claim 1 wherein said edge triggered register comprises a flip-flop having its data input connected to said input means and having a clock terminal for receiving clock input pulses.

3. The interface of claim 2 wherein said two-to-one multiplexer means comprises:
    a first AND gate having a first input thereof connected to said input means and having a second input for connection to a source of digital pulses;
    a second AND gate having a first input thereof connected to the output of said flip-flop and having a second input for connection to a source of digital pulses; and
    an OR gate having first and second inputs connected to the output of said first and second AND gates.

4. The interface of claim 3 wherein said multiplexer further comprises:
    a first inverter having an input for receiving digital pulses and an output connected to said second input of said first AND gate; and
    a second inverter having its input connected to the output of said first inverter and having its output connected to said second input of said second AND gate.

5. The interface of claim 4 wherein said input means comprises a buffer.

6. The interface of claim 5 wherein said output means comprises a buffer.

7. The interface of claim 1 wherein said input means comprises a plurality of parallel input terminals each for receiving a series of digital data and wherein said edge triggered register comprises a plurality of flip-flops each having their data input connected to one of said plurality of input terminals and each having a clock terminal for receiving clock input pulses.

8. The interface of claim 7 wherein said output means comprises a plurality of buffer amplifiers for providing parallel data outputs.

9. An interface for transmitting data in either a clock edge triggered synchronous transmission mode or an asynchronous transmission mode comprising:
    input means for receiving a series of digital data;
    an edge triggered register connected to said input means for receiving said series of digital data, including an input for receiving clock pulses and synchronizing the transmission of said series of digital data therethrough with said clock pulses;
    conducting means connected to said input means for providing a bypass path around said edge triggered register;
    output means for outputting digital pulses;
    a two-to-one multiplexer means having inputs connected to said edge triggered register and to said conducting means for selectively connecting the output of either said edge triggered register or said conducting means to said output means.

* * * * *